US008752273B2

(12) United States Patent
Miyamoto et al.

(10) Patent No.: US 8,752,273 B2
(45) Date of Patent: Jun. 17, 2014

(54) MANUFACTURING METHOD OF FOREIGN OBJECT DETECTION APPARATUS

(75) Inventors: Manabu Miyamoto, Hamamatsu (JP); Ryousuke Sakamaki, Toyohashi (JP)

(73) Assignee: Asmo Co., Ltd., Shizuoka-pref. (JP)

( * ) Notice: Subject to any disclaimer, the term of this patent is extended or adjusted under 35 U.S.C. 154(b) by 139 days.

(21) Appl. No.: 13/405,459

(22) Filed: Feb. 27, 2012

(65) Prior Publication Data

US 2012/0222296 A1 Sep. 6, 2012

(30) Foreign Application Priority Data

Mar. 3, 2011 (JP) ................................ 2011-046334
Nov. 30, 2011 (JP) ................................ 2011-262258

(51) Int. Cl.
*G01R 31/28* (2006.01)

(52) U.S. Cl.
USPC ................ 29/593; 29/592.1; 29/622; 29/825

(58) Field of Classification Search
USPC .................................. 29/622, 825, 868, 869
See application file for complete search history.

(56) References Cited

FOREIGN PATENT DOCUMENTS

JP A-11-271154 10/1999
JP 2008270077 A * 11/2008

* cited by examiner

*Primary Examiner* — Carl Arbes
(74) *Attorney, Agent, or Firm* — Posz Law Group, PLC

(57) ABSTRACT

In a manufacturing method of a foreign object detection apparatus, an elastic insulator including an attaching section and an inner peripheral portion, on which a plurality of electrodes is disposed in such a manner that each of the electrodes is away from the others, is formed, a predetermined portion of the attaching section is removed, a feeding member is coupled with the electrodes, and a coupling portion of the electrodes and the feeding member and a portion of the elastic insulator are covered with a covering part.

16 Claims, 14 Drawing Sheets

MANUFACTURING METHOD OF FOREIGN OBJECT DETECTION APPARATUS

CROSS REFERENCE TO RELATED APPLICATIONS

The present application is based on and claims priority to Japanese Patent Applications No. 2011-046334 filed on Mar. 3, 2011, and No. 2011-262258 filed on Nov. 30, 2011, the contents of which are incorporated in their entirety herein by reference.

TECHNICAL FIELD

The present disclosure relates to a manufacturing method of a foreign object detection apparatus.

BACKGROUND

A conventional automatic sliding door is attached with a foreign object detection apparatus. For example, JP-A-11-271154 discloses a foreign object detection apparatus that includes a pressure-sensitive sensor having a cord shape with a circular cross-section. The pressure-sensitive sensor is inserted in a holding portion of a protector having a cylindrical shape. The protector has an attaching leg, and the attaching leg is bonded between a pinching portion and a pinching plate disposed at a front end of a door panel. Accordingly, the pressure-sensitive sensor is attached to the door panel.

SUMMARY

It is an object of the present disclosure to provide a manufacturing method that can manufacture a foreign object detection apparatus at low cost and can improve workability in a manufacturing process.

In a manufacturing method of a foreign object detection apparatus according to an aspect of the present disclosure, an elastic insulator including an attaching section and an inner peripheral portion, on which a plurality of electrodes is disposed in such a manner that each of the electrodes is away from the others, is formed. The attaching section is configured to be attached to one of an inner peripheral portion of an opening and an outer peripheral portion of a door that closes the opening. The elastic insulator is deformable by a pressing force from a foreign object that interposes between the outer peripheral portion of the door and the inner peripheral portion of the opening. A predetermined portion of the attaching section is removed, and a feeding member is coupled with the electrodes. The feeding member is configured to supply electricity to a pressure-sensitive sensor that includes the elastic insulator and the electrodes. A coupling portion of the electrodes and the feeding member and a portion of the elastic insulator are covered with a covering part.

The above-described manufacturing method can manufacture a foreign object detection apparatus at low cost and can improve workability in a manufacturing process.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Inventors of the present application focus attention on the following. An outer cover and a protector of a conventional pressure-sensitive sensor are made of elastic material having flexibility. Thus, when a holding portion of the protector is formed into a cylindrical shape, it is troublesome to insert the pressure-sensitive sensor into the holding portion. One longitudinal end portion of the pressure-sensitive sensor is attached with a coupling member that couples electrode wires of the pressure-sensitive sensor and an external device, such as a battery disposed in a vehicle and a determination portion including an electronic control unit (ECU) for determining whether the pressure-sensitive sensor detects an interposition of a foreign object. Thus, it is required to insert the pressure-sensitive sensor into the holding portion of the protector from the other longitudinal end portion of the pressure-sensitive sensor.

In view of the foregoing, it is an object of the present disclosure is to provide a manufacturing method that can manufacture a foreign object detection apparatus at low cost and can improve workability in a manufacturing process. Exemplary embodiments of the present disclosure will be described below.

(First Embodiment)

A foreign object detection apparatus 10 manufactured by a manufacturing method according to a first embodiment of the present disclosure will be described with reference to the accompanying drawings.

Figure 1:
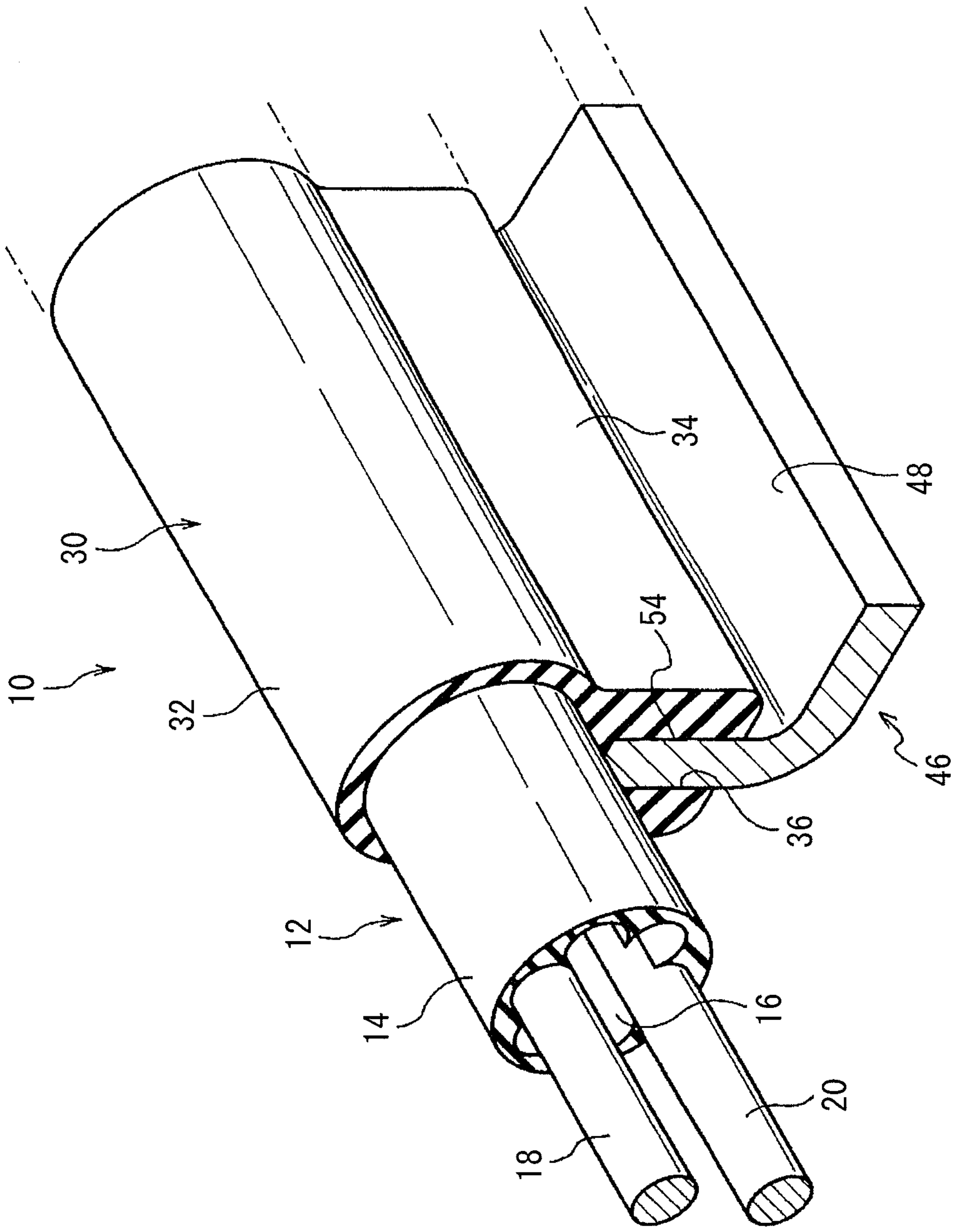
FIG. 1 is a perspective view of a longitudinally middle portion of a foreign object detection apparatus manufactured by a manufacturing method according to a first embodiment of the present disclosure.

As shown in FIG. 1, the foreign object detection apparatus 10 includes a pressure-sensitive sensor 12. The pressure-sensitive sensor 12 includes an outer cover 14. The outer cover 14 can work as a first elastic insulator. The outer cover 14 is made of an elastic insulator, such as rubber and soft synthetic resin. The outer cover 14 has a cord shape with a circular outer peripheral shape. The outer cover 14 defines a hollow portion 16 that continuously extends in a longitudinal direction of the outer cover 14.

In the hollow portion 16, two electrode wires 18, 20 are disposed. Each of the electrode wires 18, 20 includes a core wire and an elastic member that covers an outer peripheral portion of the core wire. The core wire is formed into a code shape by twisting conductive thin lines made of, for example, copper and has flexibility. The elastic member is made of conductive material, such as conductive rubber. The electrode wires 18, 20 are adhered to an inner peripheral portion of the outer cover 14 in a state where each of the electrode wires 18, 20 is away from the other through the hollow portion 16. When the outer cover 14 elastically deforms, at least one of the electrode wires 18, 20 is curved, and the electrode wire 18 and the electrode wire 20 come into contact with each other. Accordingly, electrical connection is established between the electrode wires 18, 20.

In the example shown in FIG. 1, the two electrode wires 18, 20 are disposed in the outer cover 14. The number of electrode wires may be more than two. For example, four electrode wires may be disposed in the outer cover 14.

The foreign object detection apparatus 10 further includes a protector 30. The protector 30 is made of elastic insulation material, such as rubber. The protector 30 can work as a second elastic insulator. The protector 30 includes a cylindrical section 32 having a tube shape. An inner peripheral shape of the cylindrical section 32 is a circular, and an inner diameter of the cylindrical section 32 is almost equal to an outer diameter of the outer cover 14 of the pressure-sensitive sensor 12. The pressure-sensitive sensor 12 is housed in the cylindrical section 32.

The protector 30 may be made of the same material as the outer cover 14. The protector 30 may also be made of a material different from the outer cover 14.

The protector 30 further includes an attaching section 34. The attaching section 34 is continuously formed from a side surface of the cylindrical section 32. The attaching section 34 defines an attaching groove 36 that opens toward an opposite direction from the cylindrical section 32. In the attaching groove 36, an inserted section 54 of a support bracket 46 is fitted.

The support bracket 46 is formed by bending a long flat plate at a middle portion in a width direction so that a cross section of the support bracket 46 becomes an L-shape. The support bracket 46 includes a fixed section 48 on an opposite side of the bent portion from the inserted section 54. The fixed section 48 is fixed along a front end portion of a door 44 that is included in automatic sliding door equipment 42 of a vehicle 40 or an inner peripheral fringe of an exit 50 that is opened and closed with the door 44 with a fixing member, such as a bolt. The protector 30 is attached to the support bracket 46 fixed to the door 44, in such a manner that the inserted section 54 of the support bracket 46 is fitted into the attaching section 34 of the protector 30. Accordingly, the pressure-sensitive sensor 12 is attached along the front end portion of the door 44.

In the present embodiment, the protector 30 defines the attaching groove 36 in the attaching section 34, and the inserted section 54 of the support bracket 46 is fitted into the attaching groove 36 as described above. Accordingly, the protector 30 is fixed. A configuration for fixing the protector 30 to the front end portion of the door 44 or the inner peripheral fringe of the exit 50 is not limited to the above-described configuration. For example, the attaching section 34 without the attaching groove 36 may be fixed to the front end portion of the door 44 and the inner peripheral fringe with a fixing member, such as an adhesive agent or a double-faced tape.

As described above, the attaching section 34 is configured to be attached to one of an inner peripheral portion of the exit (i.e., opening) 50 and an outer peripheral portion of the door 44 that closes the exit 50. The outer cover 14 and the protector 30 are deformable by receiving a pressing force from a foreign object that interposes between the outer peripheral portion of the door 44 and the inner peripheral portion of the exit 50.

Figure 2:
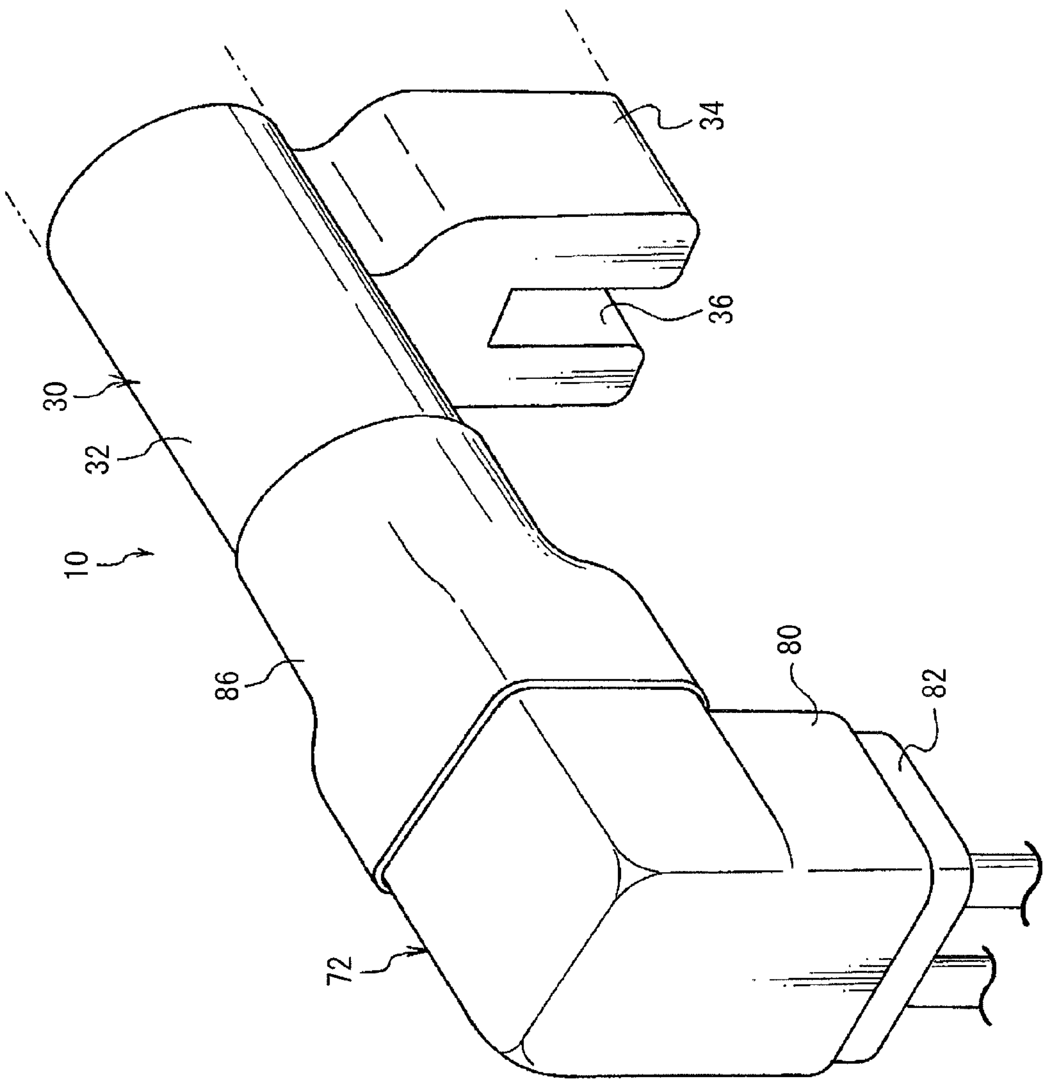
FIG. 2 is a perspective view of a portion of the foreign object detection apparatus adjacent to one longitudinal end portion.
Figure 3:
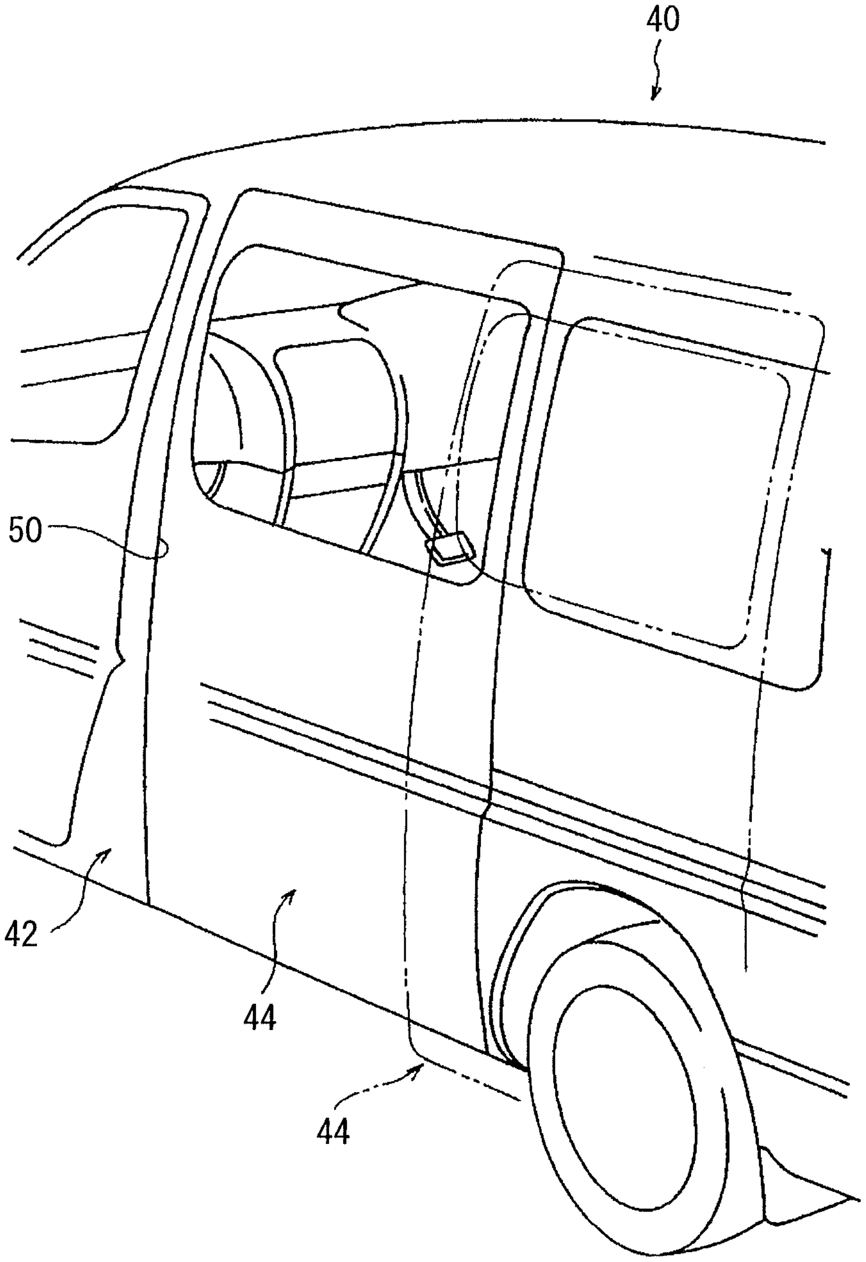
FIG. 3 is a perspective view of a vehicle to which the foreign object detection apparatus is attached.
Figure 11:
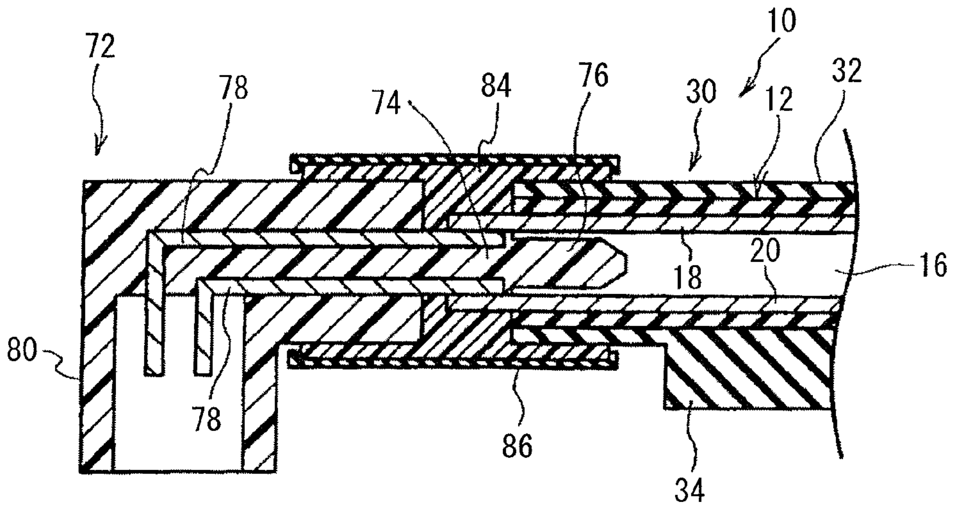
FIG. 11 is a cross-sectional view of the foreign object detection apparatus in a state where a covering member is attached in the covering process.

As shown in FIG. 2, the attaching section 34 is not provided at one longitudinal end portion of the protector 30. The one longitudinal end portion of the protector 30 and one longitudinal end portion of pressure-sensitive sensor 12 are coupled with a coupling member 72. The coupling member 73 can work as a feeding member that supplies electricity to the pressure-sensitive sensor 12. As shown in FIG. 11, the coupling member 72 includes a coupling plate 74 made of insulating material, such as synthetic resin.

The coupling plate 74 has a plate shape. From a portion of an outer periphery of the coupling plate 74, an inserted rod 76 protrudes outward. The inserted rod 76 of the coupling member 72 is fitted into the hollow portion 16 of the outer cover 14 from the one longitudinal end portion of the pressure-sensitive sensor 12 to a position at which an outer peripheral portion of the coupling plate 74 comes into contact with the one longitudinal end portions of the pressure sensitive sensor 12 and protector 30. The coupling plate 74 is attached with a pair of conductive pieces 78. Each of the conductive pieces 78 is a metal plate having conductivity and is made of, for example, copper.

One of the conductive pieces 78 is fixed to the coupling plate 74 to be exposed on one side of the coupling plate 74 in a thickness direction. The other of the conductive pieces 78 is fixed to the coupling plate 74 to be exposed on the other side of the coupling plate 74 in the thickness direction. The one of the conductive pieces 78 is electrically and mechanically coupled with the electrode wire 18, which is drawn out from the one longitudinal end portions of the pressure-sensitive sensor 12 and the protector 30. The other of the conductive pieces 78 is electrically and mechanically coupled with the electrode wire 20, which is drawn out from the one longitudinal end portions of the pressure-sensitive sensor 12 and the protector 30.

The coupling member 72 further includes a coupling section 80. The coupling portion 80 may have a box shape that defines an opening portion. The opening portion opens toward a radial outward of the outer cover 14. The pair of conductive pieces 78 is put in the coupling section 80. As shown in FIG. 2, another coupling member 82 is fitted into coupling section 80 from the opening portion. The coupling member 82 includes a pair of conductive elements that comes into contact with the pair of conductive pieces 78. The pair of conductive elements is coupled with a battery disposed in a vehicle, for example, via codes. Furthermore, one of the conductive elements is electrically coupled with a determining section, such as ECU, that determines whether the electrode wires 18, comes into contact with each other and the electrical connection is established.

In the example shown in FIG. 2, the coupling section 80 defines the opening portion that opens toward the radial outward of the outer cover 14. A direction to which the opening portion opens is not limited to the above-described example. For example, the opening portion may open toward a direction that is opposite from a direction to which the coupling plate 74 and the inserted rod 76 are provided.

Furthermore, as shown in FIG. 11, a sealing member 84 is disposed between a portion of the coupling member 72, which is located between the inserted rod 76 and the coupling section 80, and a portion of the protector 30 adjacent to the one longitudinal end portion. The coupling plate 74 is buried in the sealing member 84 liquid-tightly, and an outer periphery of the sealing member 84 is covered by the covering member 86. In other words, coupling portions of the electrode wires 18, 20 and the conductive pieces 78 of the coupling member 72 are covered with the sealing member 84 and the covering member 86. The sealing member 84 and the covering member 86 can work as a covering part.

Next, a manufacturing process of the foreign object detection apparatus 10 will be described.

Figure 4:
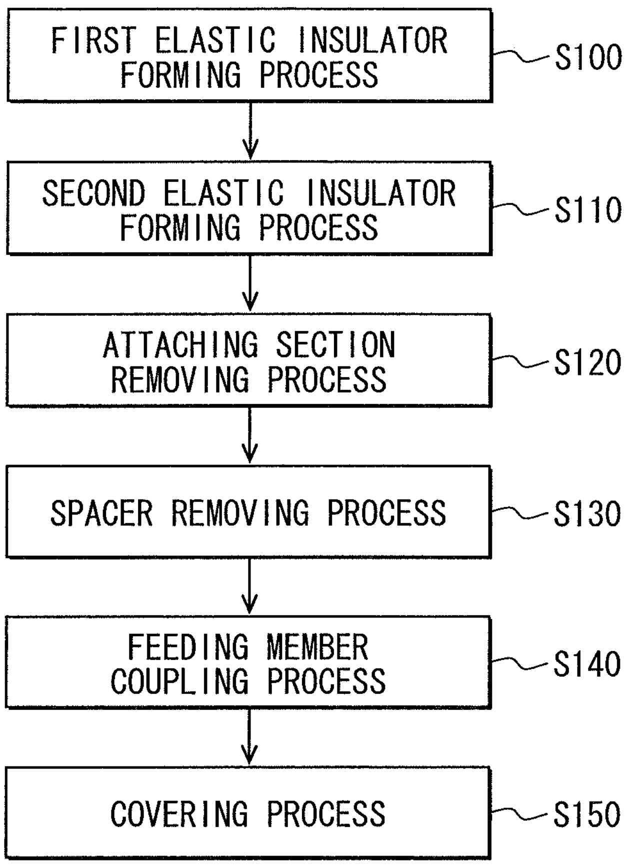
FIG. 4 is a flow diagram showing processes of the manufacturing method of the foreign object detection apparatus according to the first embodiment.
Figure 5:
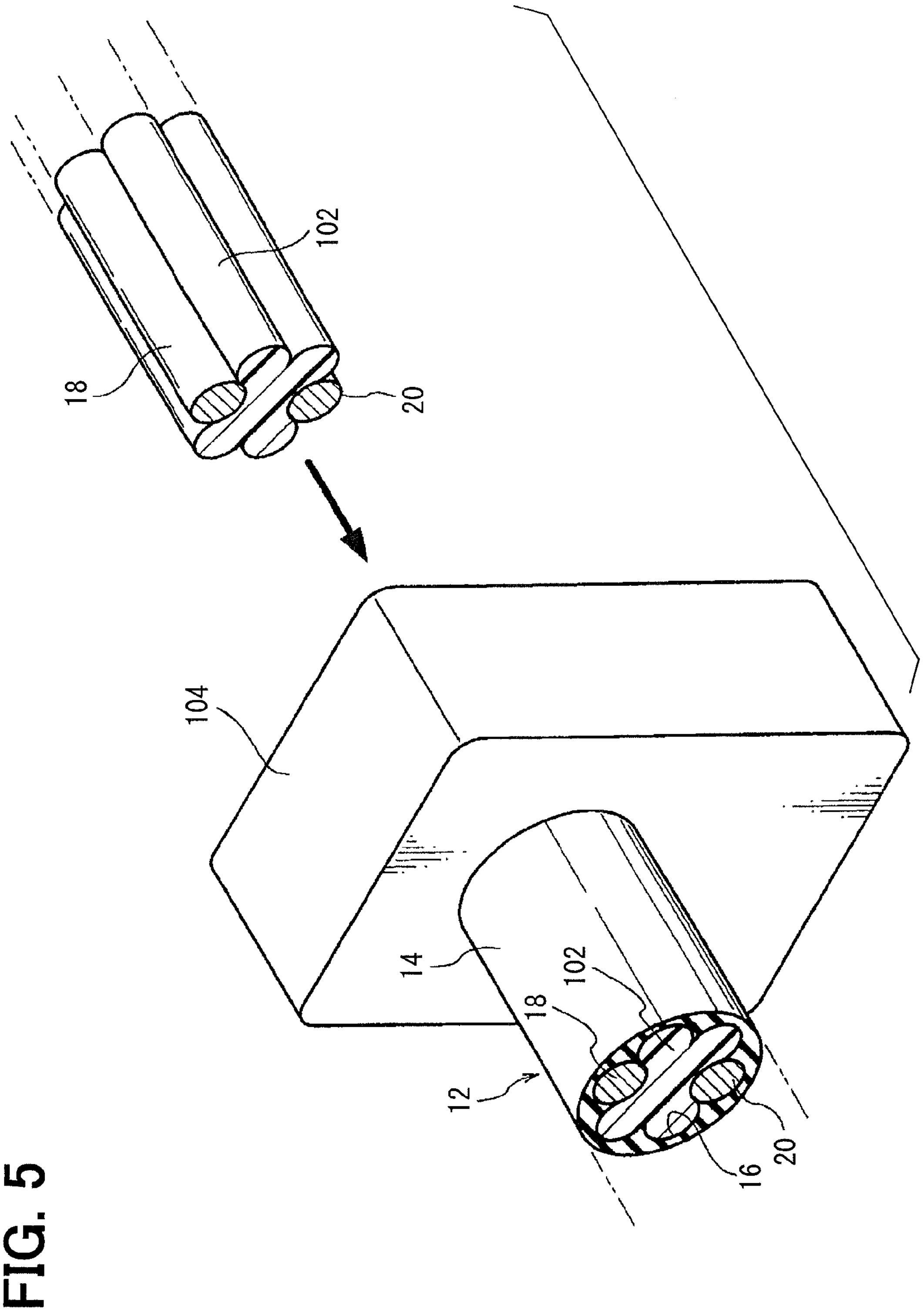
FIG. 5 is a diagram showing a first elastic insulator forming process.

As shown in FIG. 4, in a first elastic insulator forming process at S100, the pressure-sensitive sensor 12 is formed. As shown in FIG. 5, in the first elastic insulator forming process, a spacer 102 is used. The spacer 102 has an outer shape similar to an inner shape of the outer cover 14, that is, a shape of the hollow portion 16 defined by the outer cover 14. The electrode wires 18, 20 are disposed in such a manner that the spacer 102 is disposed between the electrode wire 18 and the electrode wire 20. In this state, the spacer 102 and the electrode wires 18, 20 are set in an extruder 104. As shown in FIG. 5, on outer peripheries of the spacer 102 and the electrode wires 18, 20 passed through the extruder 104, the outer cover 14 having the circular cross-section is formed. Because the spacer 102 interposes between the electrode wire 18 and the electrode wire 20, the electrode wire 18 and the electrode wire 20 do not come in contact with each other by a molding pressure when the outer cover 14 is formed by passing through the extruder 104.

Figure 6:
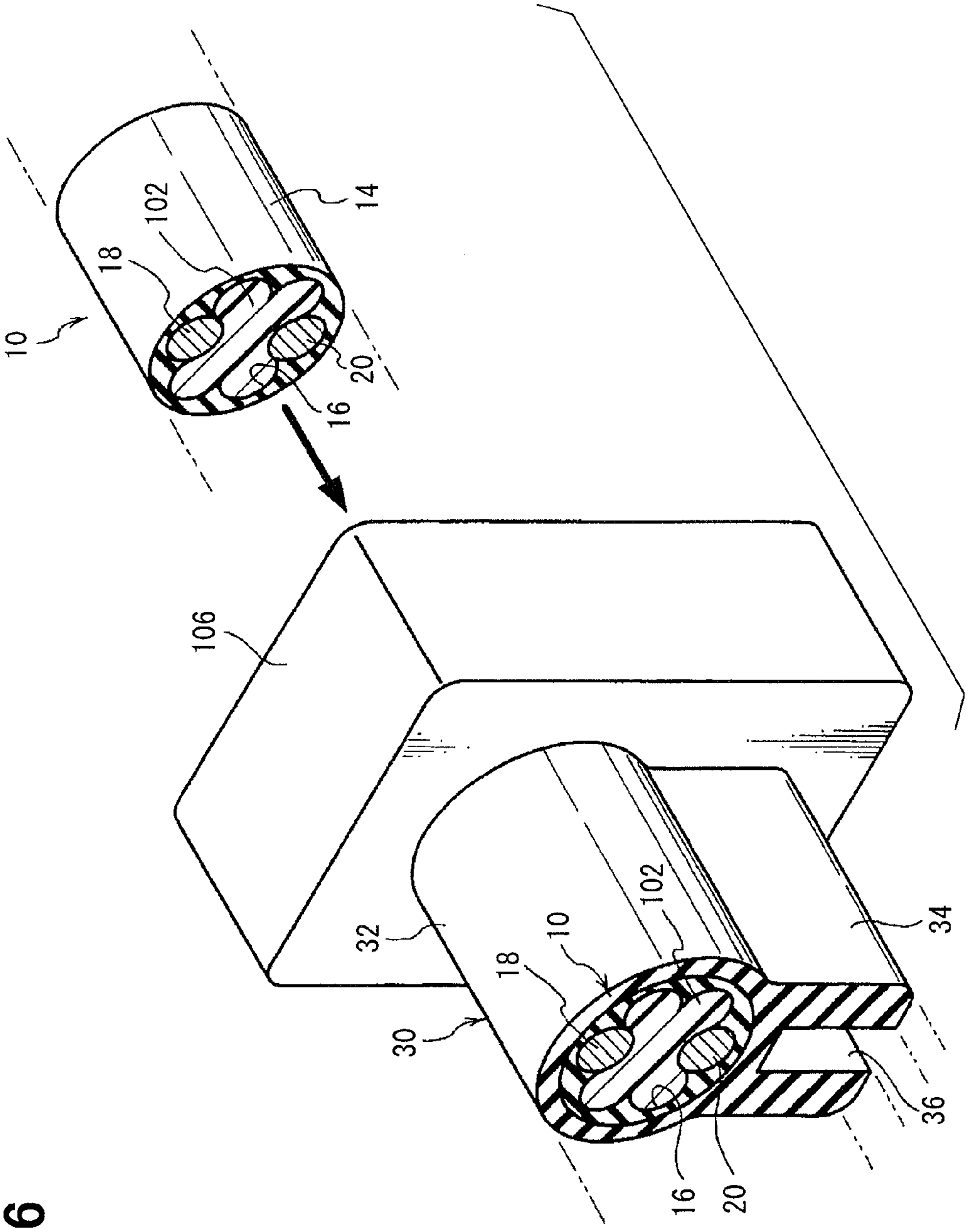
FIG. 6 is a diagram showing a second elastic insulator forming process.
Figure 7:
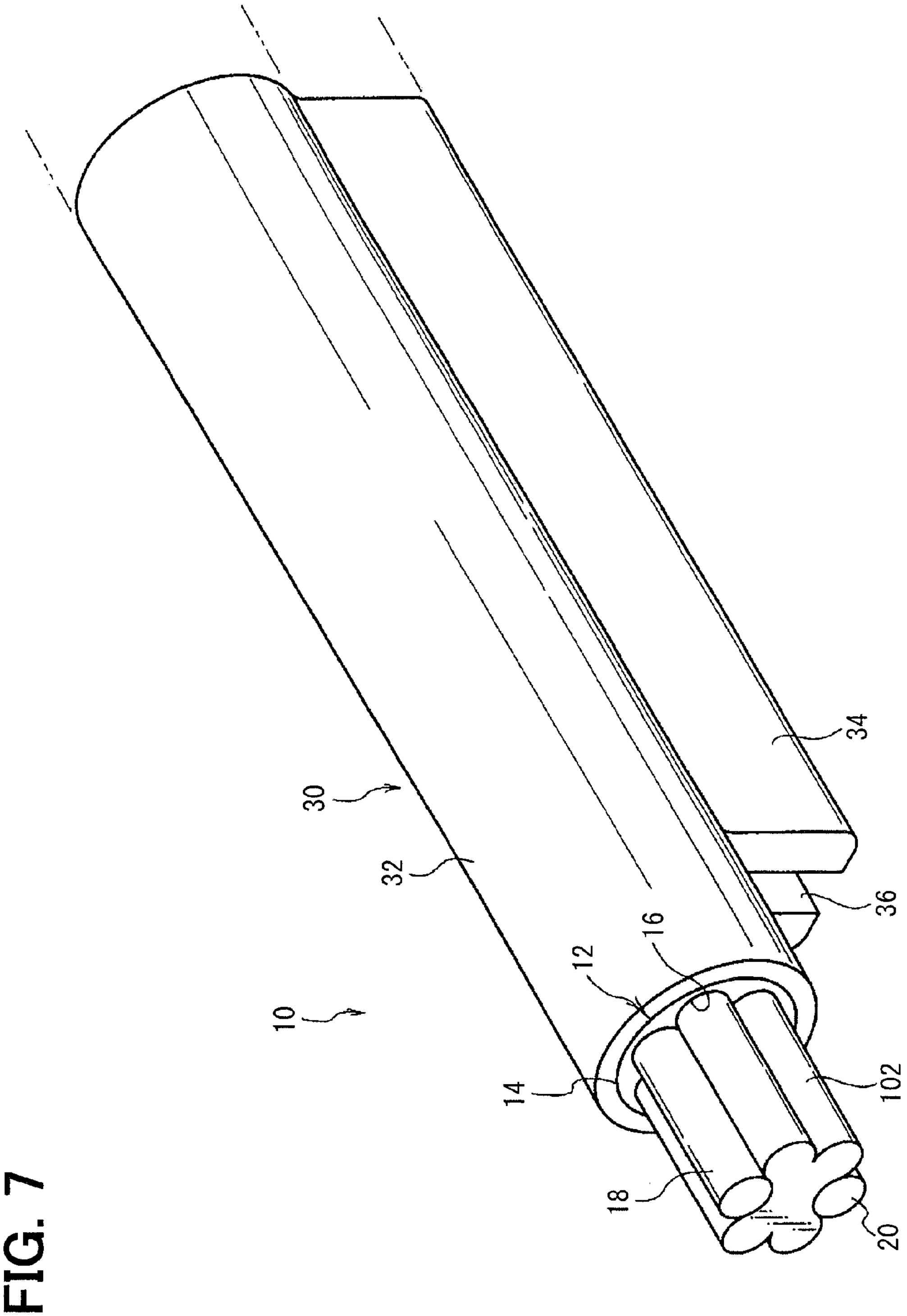
FIG. 7 is a perspective view of a portion of the foreign object detection apparatus adjacent to the one longitudinal end portion after an attaching section removing process is performed.

In a second elastic insulator forming process at S110, as shown in FIG. 6, the outer cover 14 is set in an extruder 106 from the one longitudinal end portion in a state where the electrode wires 18, 20 and the spacer 102 are disposed in the outer cover 14. On a periphery of the outer cover 14 passed through the extruder 106, the protector 30 is formed. In the present embodiment, the pressure-sensitive sensor 12 is not inserted in the cylindrical section 32 of the protector 30 that is formed separately from the pressure sensitive sensor, but the protector 30 is formed around the outer cover 14 using the extruder 106. Thus, a troublesome process of inserting the pressure-sensitive sensor 12 into the cylindrical section 32 of the protector 30 is not required, workability in the manufacturing process can be improved, and a manufacturing cost can be reduced.

In the second elastic insulator forming process, the protector 30 is formed around the outer cover 14 in a state where the spacer 102 is disposed in the outer cover 14. Thus, the electrode wire 18 and the electrode wire 20 do not come in contact with each other by a molding pressure when the protector 30 is formed using the extruder 106.

In an attaching section removing process at S120, a portion of the attaching section 34 adjacent to the one longitudinal end portion of the protector 30 and other predetermined portion are removed. In the attaching section removing process, the portion adjacent to the one longitudinal end portion of the protector 30 and the predetermined portion is removed in a state where the spacer 102 is disposed in the outer cover 14. Thus, even when the protector 30 and the outer cover 14 are elastically deformed in the attaching section removing process, the electrode wire 18 do not come in contact with the electrode wire 20. In the above-described example, the portion of the attaching section 34 adjacent to the one longitudinal end portion of the protector 30 is removed in the attaching section removing process. However, the portion of the attaching section 34 removed in the attaching section removing process is not limited to the portion adjacent to the one longitudinal end portion of the protector 30. For example, when a bent portion is provided in a longitudinally middle portion of the protector 30 so that the protector 30 can be appropriately bent at the bent portion when the foreign object detection apparatus 10 is attached to the vehicle, the bent portion may be removed in the attaching section removing process.

In a spacer removing process at S130, the spacer 102 is pulled out from the one longitudinal end portion or the other longitudinal end portion of the outer cover 14. Accordingly, the hollow portion 16 is provided in the outer cover 14, and the electrode wire 18 faces the electrode wire 20 through the hollow portion 16.

Figure 8:
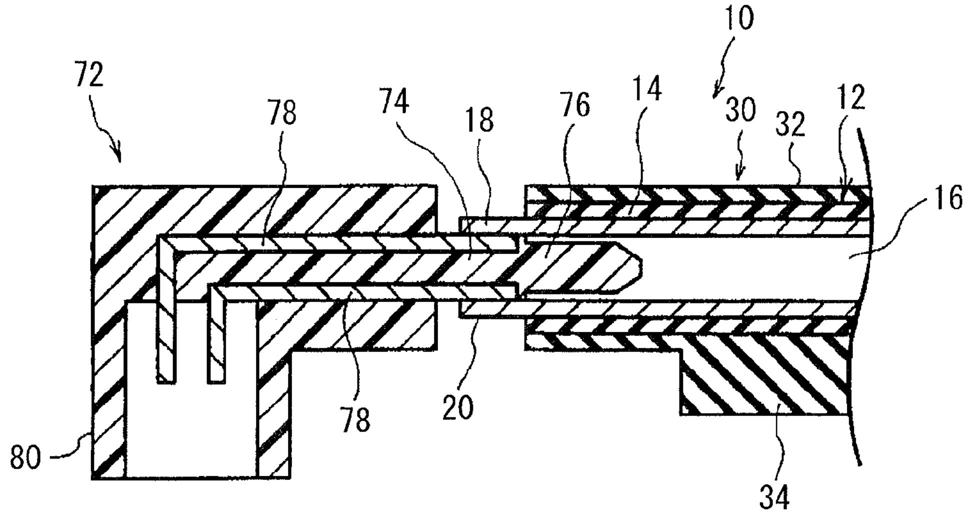
FIG. 8 is a cross-sectional view of the foreign object detection apparatus in a feeding member coupling process.
Figure 9:
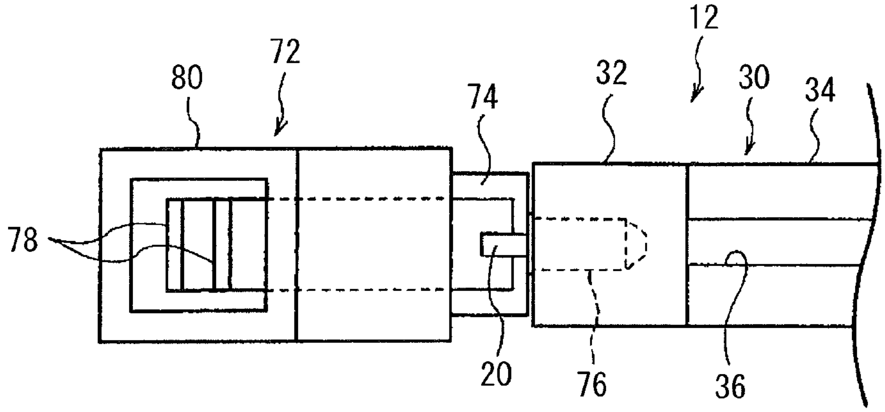
FIG. 9 is a diagram showing the foreign object detection apparatus in the feeding member coupling process viewed from a lower side of FIG. 8.

In a feeding member coupling process at S140, as shown in FIG. 8, the inserted rod 76 of the coupling member 72 is fitted into the hollow portion 16 to a position where the outer peripheral portion of the coupling plate 74 comes into contact with the one longitudinal end portion of the outer cover 14. Subsequently, the electrode wire 18 is electrically and mechanically coupled with one of the conductive pieces 78 disposed on the coupling plate 74, and the electrode wire 20 is electrically and mechanically coupled with the other of the conductive pieces 78. Because the portion of the attaching section 34 adjacent to the one longitudinal end portion of the protector 30 is removed in the attaching section removing process, the conductive pieces 78 and the electrode wires 18, 20 can be easily coupled.

Figure 10:
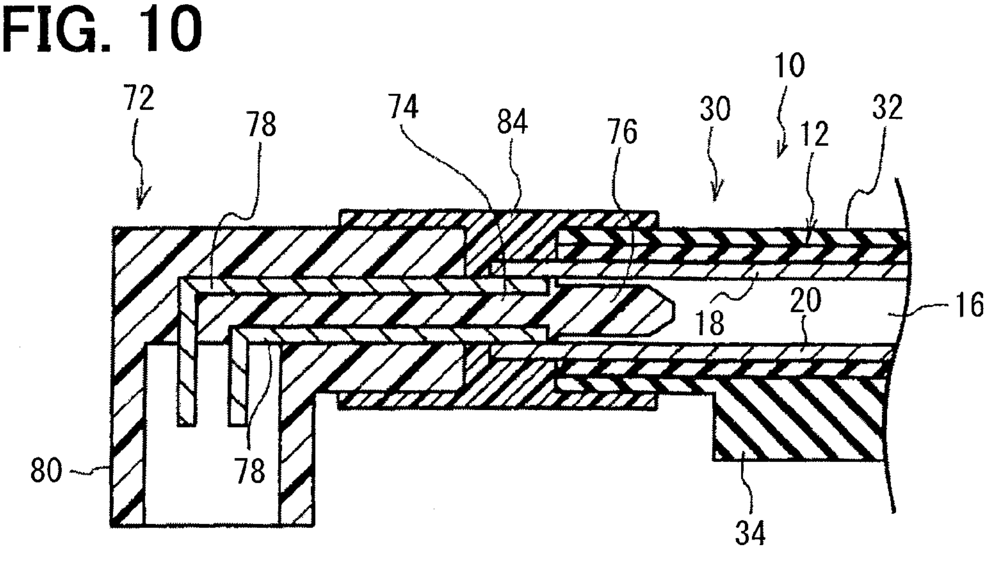
FIG. 10 is a cross-sectional view of the foreign object detection apparatus in a state where a sealing member is applied in a covering process.

In a covering process at S150, as shown in FIG. 10, the sealing member 84 in a liquid state is applied between a portion of the coupling member 72 located between the inserted rod 74 and the coupling section 80 and the portion of the protector 30 adjacent to the one longitudinal end portion. Accordingly, the coupling plate 74 and a portion of the coupling member 72 around the coupling plate 74 are sealed with the sealing member 84 liquid-tightly. After the sealing member 84 becomes hardened, as shown in FIG. 11, the sealing member 84 is covered with the covering member 86. Because the portion of the attaching section 34 adjacent to the one longitudinal portion of the protector 30 is removed in the attaching section removing process, the sealing member 84 can be easily applied, and the covering member 86 can be easily attached.

Since the coupling plate 74 and the portion of the coupling member 72 around the coupling plate 74 are sealed with the sealing member 84 liquid-tightly, the electrode wires 18, 20 drawn out from the one longitudinal end portion of the outer cover 14 and the coupling portions of the electrode wires 18, 20 and the conductive pieces 78 are restricted from getting wet, for example, by rain. Thus, the electrode wires 18, 20 can be electrically and mechanically coupled with the conductive pieces 78 appropriately for a long time.

Figure 12:
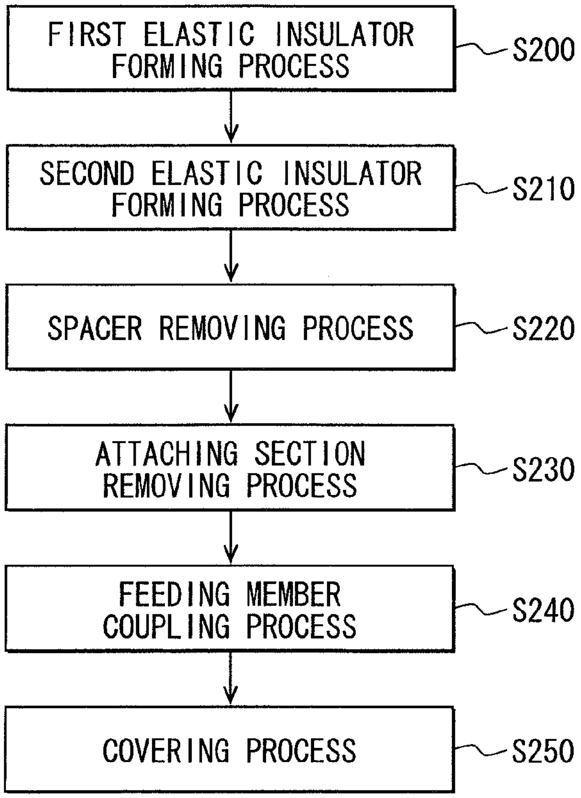
FIG. 12 is a flow diagram showing processes of a manufacturing method of a foreign object detection apparatus according to a modification.
Figure 13:
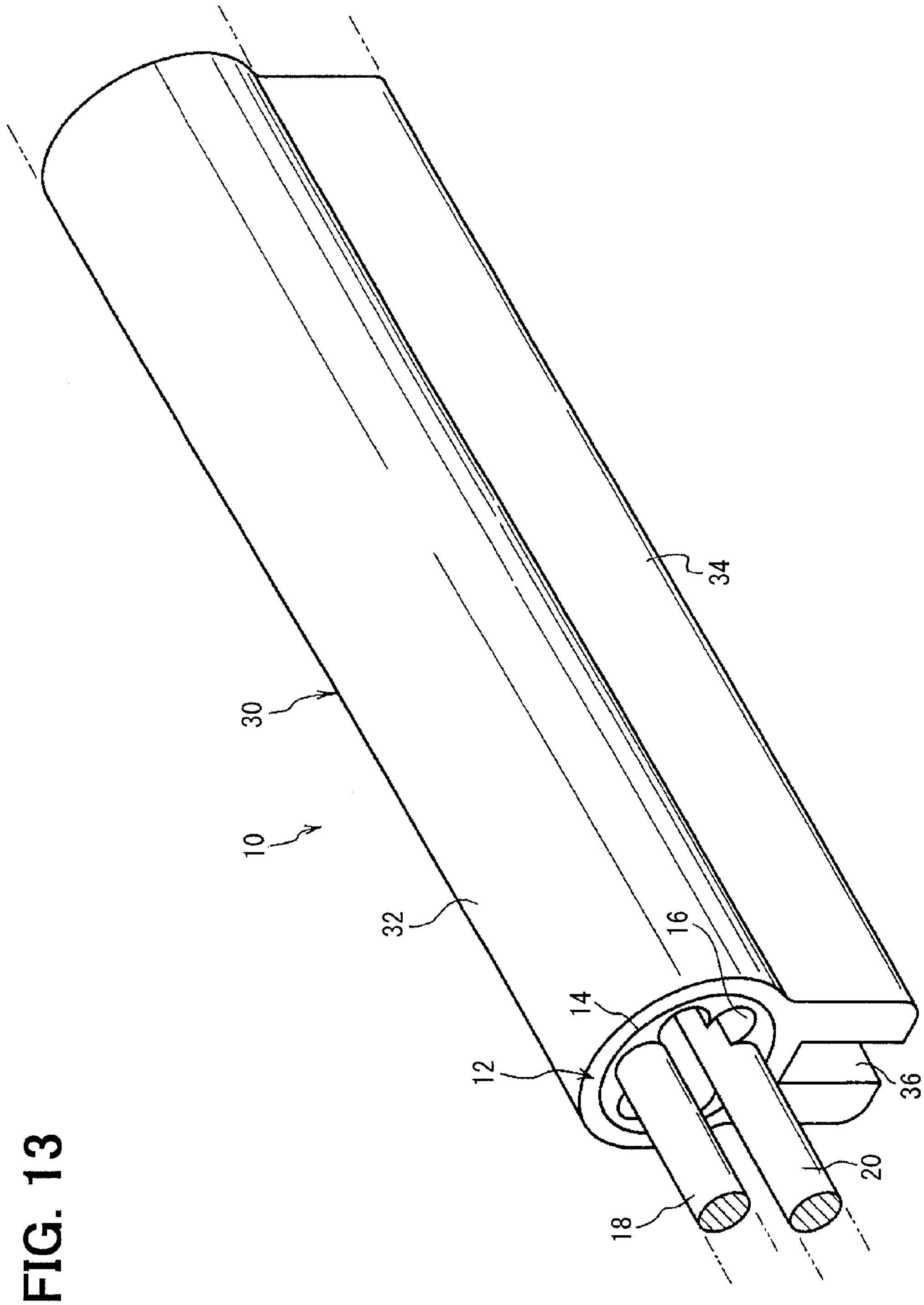
FIG. 13 is a perspective view of a portion of the foreign object detection apparatus adjacent to one longitudinal end portion after an attaching section removing process in the manufacturing method according to the modification is performed.
Figure 14:
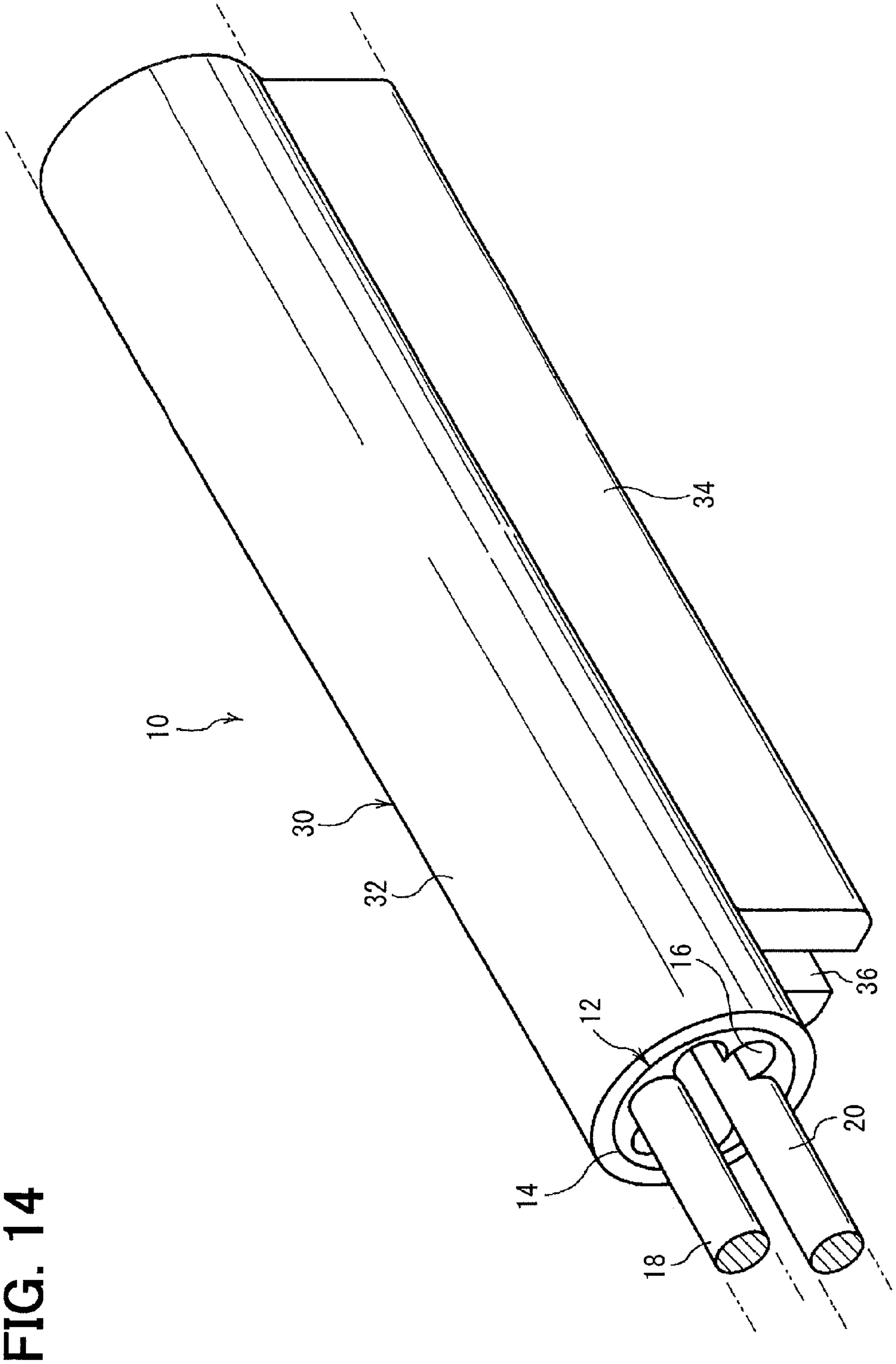
FIG. 14 is a perspective view of the portion of the foreign object detection apparatus adjacent to the one longitudinal end portion after a spacer removing process in the manufacturing method according to the modification is performed.

In the above-described, the attaching section removing process is performed between the second elastic insulator forming process and the spacer removing process. However, the spacer removing process may also be performed between the second elastic insulator forming process and the attaching section removing process as shown in FIG. 12. In a manufacturing process shown in FIG. 12, the first elastic insulator forming process is performed at S200, and the second elastic insulator forming process is performed at S210. After the second elastic insulator forming process, as shown in FIG. 13, the spacer 102 may be pulled out from the inside of the outer cover 14 in the spacer removing process at S220, and then the portion of the attaching section 34 adjacent to the one longitudinal end portion of the protector 30 may be removed in the attaching section removing process at S230 as shown in FIG. 14. After that, the feeding member coupling process is performed at S240, and the covering process is performed at S250.

In the above-described example, the cross-sectional shape of the inner peripheral portion of the outer cover 14 is non-circular. However, the cross-sectional shape of the inner peripheral portion of the outer cover 14 may also be circular, that is, the outer cover 14 may have a cylindrical shape. In a case where the outer cover 14 has a cylindrical shape, the outer cover 14 may have a thickness same as a thickness of the cylindrical section 32 of the protector 30.

Figure 15:
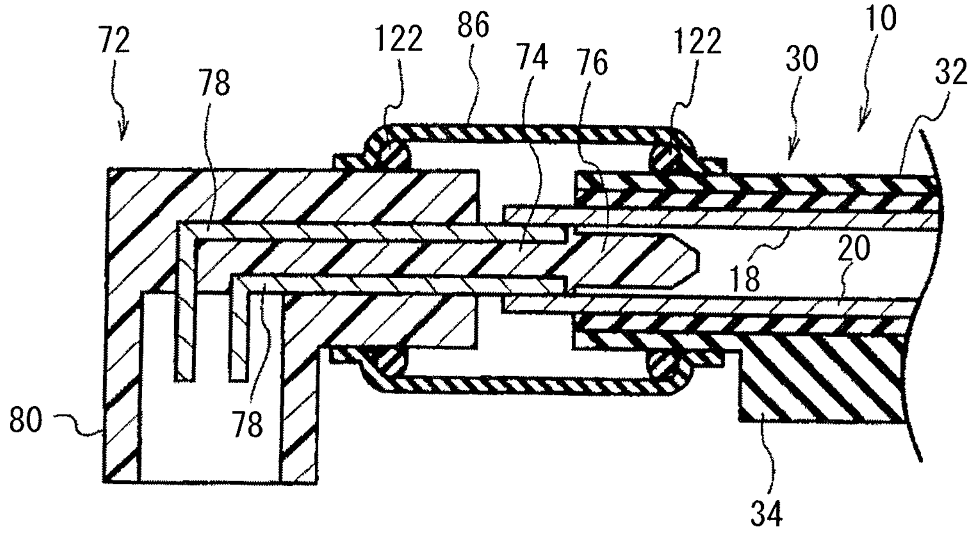
FIG. 15 is a cross-sectional view of a foreign object detection apparatus including a sealing member according to another modification.

In the above-described example, the sealing member 84 in the liquid state is applied to the portion of the coupling member 72, which is located between the inserted rod 76 and the coupling section 80, and the portion of the protector 30 adjacent to the one longitudinal end portion. However, as shown in FIG. 15, O-rings 122 may be disposed between the coupling member 72 and the covering member 86 and between the portion of the protector 30 adjacent to the one longitudinal end portion and the covering member 86. In other words, the covering part may include the O-rings 122.

(Second Embodiment)

A foreign object detection apparatus 140 manufactured by a manufacturing method according to a second embodiment of the present disclosure will be described.

Figure 16:
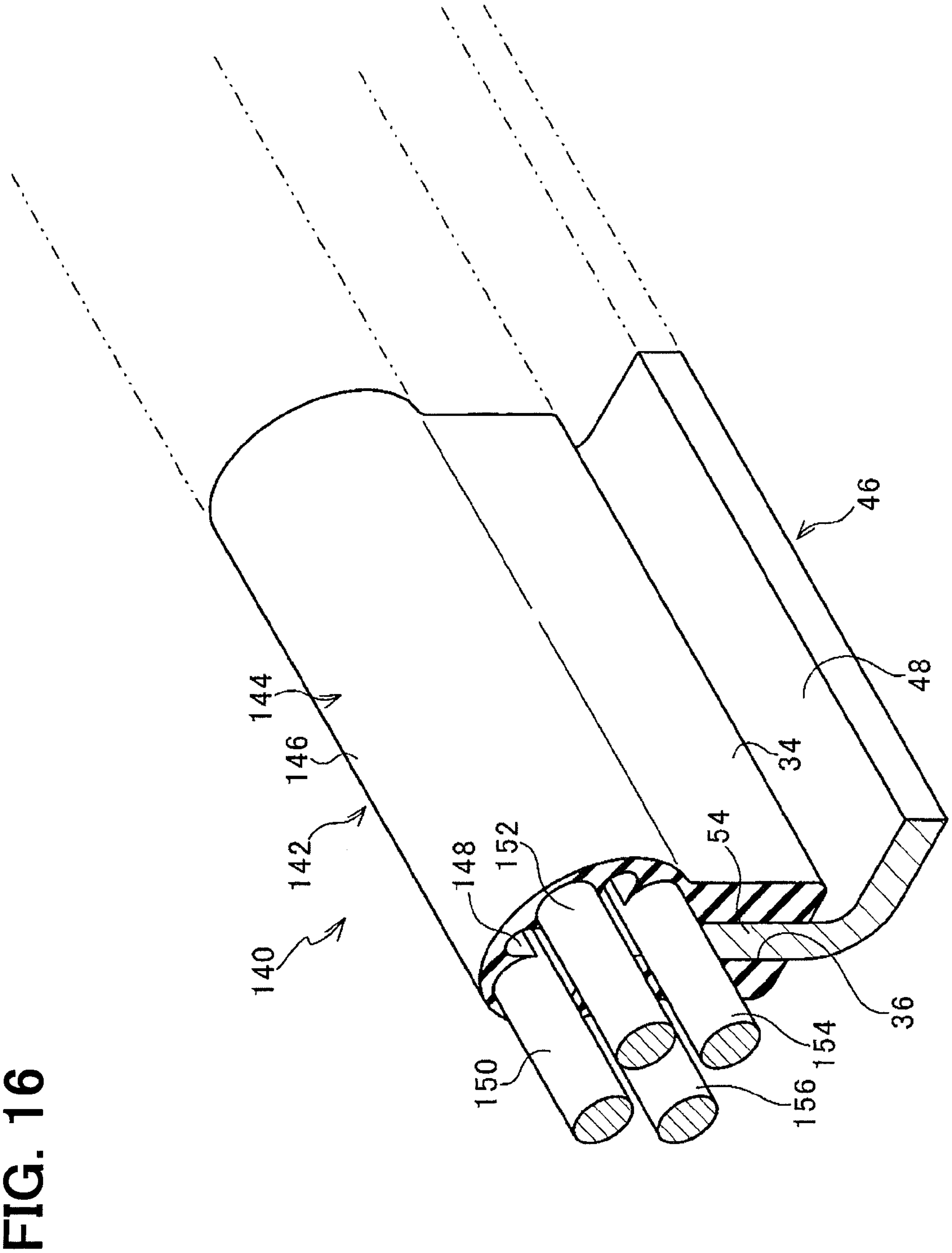
FIG. 16 is a perspective view of a longitudinally middle portion of a foreign object detection apparatus manufactured by a manufacturing method according to a second embodiment of the present disclosure.

As shown in FIG. 16, the foreign object detection apparatus 140 includes a pressure-sensitive sensor 142. The pressure-sensitive sensor 142 includes a protector 144 as an elastic insulator and does not include the outer cover 14 and the protector 30. The protector 144 includes a cylindrical section 146. The cylindrical section 146 defines a hollow portion 148. A cross-sectional shape of the hollow portion 148 is a cross shape, that is, an X-shape. In the vicinity of an intersection of the cross shape, four electrode wires 150, 152, 154, 156 are disposed so as to be away from each other.

At an outer peripheral portion of the cylindrical section 146, an attaching section 34 is disposed. The attaching section 34 defines an attaching groove 36 in which the inserted section 54 of the support bracket 46 is fitted.

In other words, the outer cover 14 and the protector 30 are not provided separately in the present embodiment, and the protector 144, in which the outer cover 14 and the protector 30 are integrated, is provided. The protector 144 may be made of material similar to or different from the material of the outer cover 14 described in the first embodiment.

Figure 17:
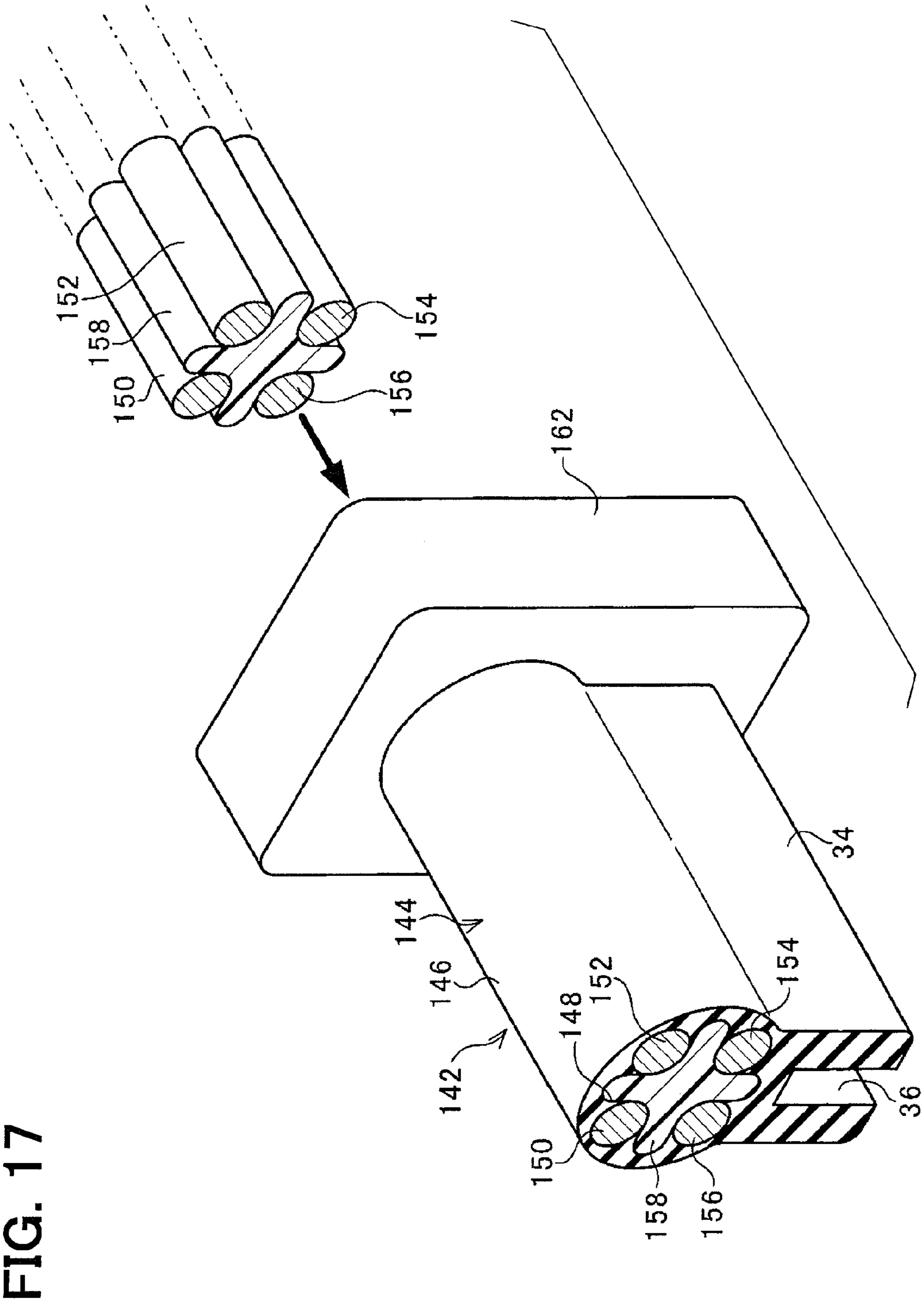
FIG. 17 is a perspective view of the foreign object detection apparatus in an elastic insulator forming process in the manufacturing method according to the second embodiment.

In the present embodiment, the pressure-sensitive sensor 142 is manufactured in an elastic insulator forming process. As shown in FIG. 17, in the elastic insulator forming process, a spacer 158 is used. The spacer 158 has a cord shape, and an outer peripheral shape of the spacer 158 is a cross shape similar to the inner peripheral shape of the hollow portion 148. The electrode wires 150-156 are disposed on an outer periphery of an intersection portion of the spacer 158 so as to extend along a longitudinal direction of the spacer 158. In the above-described state, the spacer 158 and the electrode wires 150-156 are set in an extruder 162 from one longitudinal end portion.

As shown in FIG. 17, the protector 144 is formed on outer peripheries of the spacer 158 and the electrode wires 150-156 passed through the extruder 162. Because the spacer 158 interposes between each of the electrode wires 150-156 and the others, each of the electrode wires 150-156 does not come in contact with the others by a molding pressure when the protector 144 is formed by passing the through the extruder 162.

Then, the foreign object detection apparatus 140 is manufactured through an attaching section removing process, a spacer removing process, a feeding member coupling process, and a covering process in a manner similar to the first embodiment. Accordingly, advantages similar to the advantages of the first embodiment can be obtained.

Furthermore, in the present embodiment, the outer cover 14 and the protector 30 are not separately provided, the cylindrical section 146 of the protector 144 defines the hollow portion 148, and the electrode wires 150-156 are disposed in the hollow portion 148. Thus, the number of components can be reduced, and it is not required to divide the elastic insulator forming process into a first elastic insulator forming process and a second insulator forming process. Accordingly, a component cost and a manufacturing cost can be reduced.

In the pressure-sensitive sensor 142 of the foreign object detection apparatus 140, the electrode wires 150-156 having cord shapes are linearly arranged so as to be parallel to each other. However, shapes of electrodes are not limited to the above-described example. For example, the hollow portion 148 may have a spiral shape in which an inner peripheral shape gradually changes in a longitudinal direction around a center of the hollow portion 148, and the electrode wires 150-156 may be curved spirally around the center of the hollow portion 148 in the longitudinal direction of the hollow portion 148. Also in the present case, the manufacturing process according to the present embodiment can be applied by changing the outer peripheral shape of the spacer 158 to correspond to the shape of the hollow portion 148 and the electrode wires 150-156.

In the above-described embodiments, the present disclosure is applied to the manufacturing method of the foreign object detection apparatus 10 or the foreign object detection apparatus 140 for detecting an interposition of a foreign object in the automatic sliding door equipment 42. However, the present disclosure may also be applied to a manufacturing method of a foreign object detection apparatus for detecting an interposition of a foreign object in an automatic backdoor equipment that is opened and is closed by a driving force of a motor. The present disclosure may also be applied to a manufacturing method of a foreign object detection apparatus for detecting an interposition of a foreign object in a power window equipment in which door glass moves vertically.

In the above-described embodiments, the electrode wires 18, 20, 150, 152, 154, 156 having the cord shape are provided as the electrodes. However, shapes of the electrodes are not limited to cord shapes. For example, one of a plurality of electrodes may be made of a flexible rectangular wire having a rectangular cross-sectional shape.

What is claimed is:

1. A manufacturing method of a foreign object detection apparatus comprising:

forming an elastic insulator including an attaching section and an inner peripheral portion, on which a plurality of electrodes is disposed in such a manner that each of the plurality of electrodes is away from the others, the attaching section configured to be attached to one of an inner peripheral portion of an opening and an outer peripheral portion of a door that closes the opening, the elastic insulator being deformable by a pressing force from a foreign object that interposes between the outer peripheral portion of the door and the inner peripheral portion of the opening;

removing a predetermined portion of the attaching section;

coupling a feeding member with the plurality of electrodes, the feeding member configured to supply electricity to a pressure-sensitive sensor that includes the elastic insulator and the plurality of electrodes; and covering a coupling portion of the plurality of electrodes and the feeding member and a portion of the elastic insulator with a covering part.

2. The manufacturing method according to claim 1, wherein the forming the elastic insulator includes:

forming a first elastic insulator on an outer periphery of the plurality of electrodes in a state where each of the plurality of electrodes is away from the others; and forming a second elastic insulator including the attaching section on an outer periphery of the first elastic insulator in which the plurality of electrodes is disposed.

3. The manufacturing method according to claim 1, wherein the forming the elastic insulator includes forming the elastic insulator on an outer periphery of the plurality of electrodes in a state where a spacer is disposed between each of the plurality of electrodes and the others.

4. The manufacturing method according to claim 1, wherein the forming the elastic insulator includes:

disposing a spacer between each of the plurality of electrodes and the others;

forming a first elastic insulator on outer peripheries of the spacer and the plurality of electrodes by passing the spacer and the plurality of electrodes through an extruder in a state where the spacer is disposed between each of the plurality of electrodes and the others; and forming a second elastic insulator including the attaching section on an outer periphery of the first elastic insulator by passing the first elastic insulator, the spacer, and the plurality of electrodes through an extruder in a state where the spacer is disposed between each of the plurality of electrodes and the others.

5. The manufacturing method according to claim 1, wherein the forming the elastic insulator includes:

disposing a spacer between each of the plurality of electrodes and the others; and forming the elastic insulator on outer peripheries of the spacer and the plurality of electrodes by passing the spacer and the plurality of electrodes through an extruder in a state where the spacer is disposed between each of the plurality of electrodes and the others.

6. The manufacturing method according to claim 3, further comprising removing the spacer from between each of the plurality of electrodes and the others after removing the predetermined portion of the attaching section and before coupling the feeling member with the plurality of electrodes.

7. The manufacturing method according to claim 1, wherein the covering part includes a sealing member that liquid-tightly seals the coupling portion of the plurality of electrodes and the feeding member.

8. The manufacturing method according to claim 1, wherein the removing of the predetermined portion of the attaching section creates an attaching groove configured to secure to a support bracket.

9. The manufacturing method according to claim 1, wherein at least a portion of the covering part is configured to be attachable to and detachable from the coupling portion.

10. The manufacturing method according to claim 1, the forming of the elastic insulator includes:

forming a hollow portion between the plurality of electrodes;

forming a first elastic insulator on an outer periphery of the plurality of electrodes in a state where each of the plurality of electrodes is separated from the others by the hollow portion; and forming a second elastic insulator including the attaching section on an outer periphery of the first elastic insulator in which the plurality of electrodes is disposed.

11. The manufacturing method according to claim 2, wherein the second elastic insulator is formed to be in contact with an entire outer peripheral surface of the first elastic insulator.

12. The manufacturing method according to claim 3, wherein the spacer is configured to be removable by pulling the spacer out of a first longitudinal end portion of the elastic insulator or out of a second longitudinal end portion of the elastic insulator.

13. The manufacturing method according to claim 4, wherein the spacer is configured to be removable by pulling the spacer out of a first longitudinal end portion of the elastic insulator or out of a second longitudinal end portion of the elastic insulator.

14. The manufacturing method according to claim 5, wherein the spacer is configured to be removable by pulling the spacer out of a first longitudinal end portion of the elastic insulator or out of a second longitudinal end portion of the elastic insulator.

15. The manufacturing method according to claim 6, wherein the spacer is removed by pulling the spacer out of a first longitudinal end portion of the elastic insulator or out of a second longitudinal end portion of the elastic insulator.

16. The manufacturing method according to claim 7, wherein the covering part includes a covering member that is configured to cover the sealing member, and the covering member is configured to be attachable to and detachable from a position covering the sealing member.

* * * * *